United States Patent [19]

Walchle

[11] Patent Number: 4,825,330

[45] Date of Patent: Apr. 25, 1989

[54] ULTRA-FAST SOLID STATE POWER INTERRUPTER

[75] Inventor: Ray W. Walchle, Mt. Airy, Md.

[73] Assignee: The United States of America as represented by the Department of Health and Human Services, Washington, D.C.

[21] Appl. No.: 105,335

[22] Filed: Oct. 6, 1987

[51] Int. Cl.⁴ .......................................... H02H 3/087
[52] U.S. Cl. ...................................... 361/95; 361/101
[58] Field of Search ..................... 361/87, 93, 94, 95, 361/96, 100, 101, 5, 13, 102; 323/239, 277, 278

[56] References Cited

U.S. PATENT DOCUMENTS

| | | | |
|---|---|---|---|
| 3,049,632 | 8/1962 | Staples | 310/97 |
| 3,210,605 | 10/1965 | Jones | 361/100 |
| 3,925,709 | 12/1975 | Mitchell et al. | 361/100 |
| 4,061,961 | 12/1977 | Baker | 361/100 X |
| 4,119,906 | 10/1978 | Gonda | 323/278 |
| 4,396,882 | 8/1983 | Kellenbenz | 323/278 |
| 4,428,017 | 1/1984 | Vaerewyck et al. | 361/93 X |
| 4,438,473 | 3/1984 | Cawley et al. | 361/101 X |

OTHER PUBLICATIONS

"Automated Test set for Checking Biomedical Equipment", Walter S. Friauf, Horace E. Cascio and Alexander E. Jones, National Institutes of Health Public Service, Nov.–Dec. 1973.

"AC Circuit Breaker Has Adjustable Threshold", by Kurt French, Design Ideas, EDN Jun. 12, 1986.

*Primary Examiner*—Derek S. Jennings
*Attorney, Agent, or Firm*—Browdy & Neimark

[57] ABSTRACT

A power interrupter for non-destructively protecting for instance 120 Vac equipment test when that equipment is likely (i.e., expected or designed) to develop a short circuit across the ac power line. The speed of response (50-microsecond turn-off) is significantly faster than that of ordinary line circuit breakers or fuses, both of which react in milliseconds. The device can be applied to any circuit protection problem where speed of response is crucial.

24 Claims, 4 Drawing Sheets

ULTRA-FAST SOLID STATE POWER INTERRUPTER

BACKGROUND OF THE INVENTION

The present invention pertains to an interruption of power supplied to a load, such as for when a short circuit develops across the load.

Various circuits for interrupting the supply of power to a load, when a short circuit across the load develops, to prevent damage as a result of excess current, are known in the art. These involve elements in series with the load current, having slow response times, or involving inadequate isolation between components. Often such prior art is not directed to switching ac power, and the load current at which interruption occurs is not freely adjustable down to zero.

SUMMARY OF THE INVENTION

An object of the present invention is to provide a power interrupter for rapidly interrupting power supplied to a load when the current supplied to the load exceeds a predetermined and selectable value.

A further object is to provide the interruption within 50 microseconds after commencement of the excess current. A further object is to provide the interruption on the occurrence of the excess current within a precision of ±0.2 Aac over a 20 Aac RMS operating range.

The above objects are provided by an electronic switch passing the current to the load, a current sensor connected to the electronic switch for sensing the current being supplied to the load, a switch control connected to receive as an input an output of the current sensor, and to provide an output to the electronic switch for interrupting the current, and an operator control for setting the level at which the interruption occurs.

DESCRIPTION OF PREFERRED EMBODIMENTS

A device has been developed by the federal Food and Drug Administration for use in nondestructive performance testing of line-shorting safety interlocks in microwave ovens, as required in 21 CFR 1030.10 "Performance Standards for Microwave and Radio Frequency Emitting Products" promulgated under PL 90-602.

An ultra-fast solid-state power interrupter (UFSSPI) within the context of the present invention is an electronic device which is inserted between a line-operated load and its source of power. The UFSSPI monitors the load current and disconnects power from the load within for instance 50 microseconds after a pre-selected current (interrupt) level is exceeded. A digital panel meter displays the pre-selected interrupt level with a minimum accuracy of ±0.2 Aac over a 20-ampere-RMS operating range of the device, for example. A low-voltage signal corresponding to the rectified waveform of the load current is made available as an output. The following describes the theory of operation, circuitry, performance characteristics, and packaging of the UFSSPI, in terms of an exemplary embodiment which is not intended to be limiting in any manner.

Figure 1:
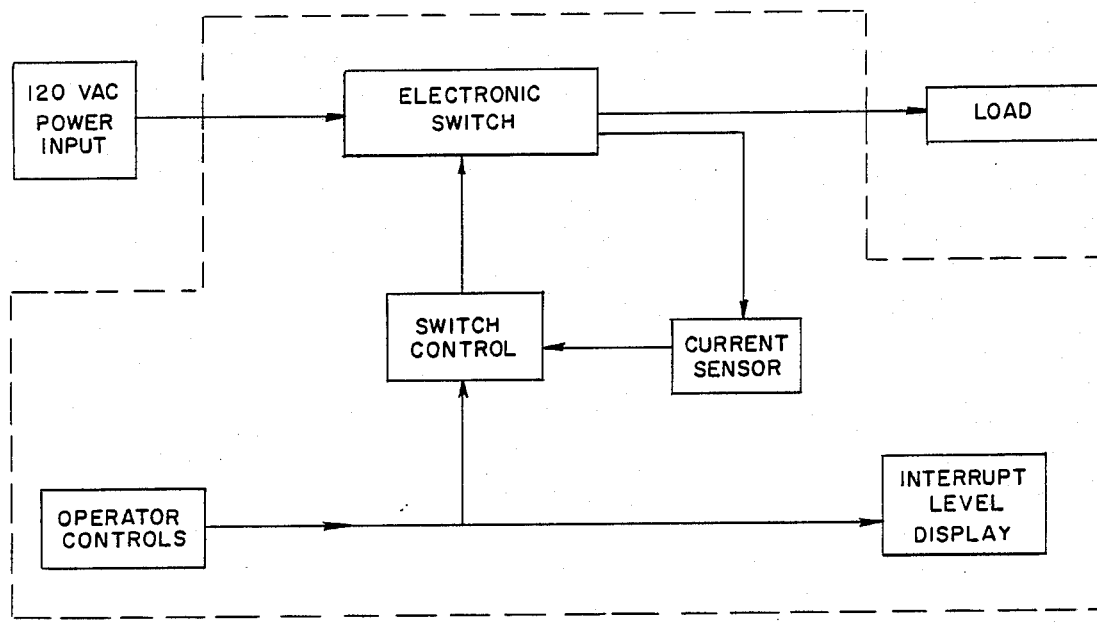
FIG. 1 shows a system block diagram for a power interrupter according to the present invention.

The system block diagram is shown in FIG. 1. The input power (at 120 vac) enters the device, is controlled through an Electronic Switch, sampled by the Current Sensor circuit, and exits to the load (such as a device under test). The current control elements in the Electronic Switch are actuated by a signal from the Switch Control circuit; the latter receives its input signals from the Operator Controls and the Current Sensor circuit. The Operator Controls enable the operator to close or to open the Electronic Switch manually and to adjust the interrupt level for automatic opening (turnoff) of the Electronic Switch. The interrupt level selected by the operator is indicated on the Interrupt Level Display. The Current Sensor provides a feedback signal to enable the Switch Control to automatically open the Electronic Switch if the load current exceeds the interrupt level selected by the operator.

Figure 2:
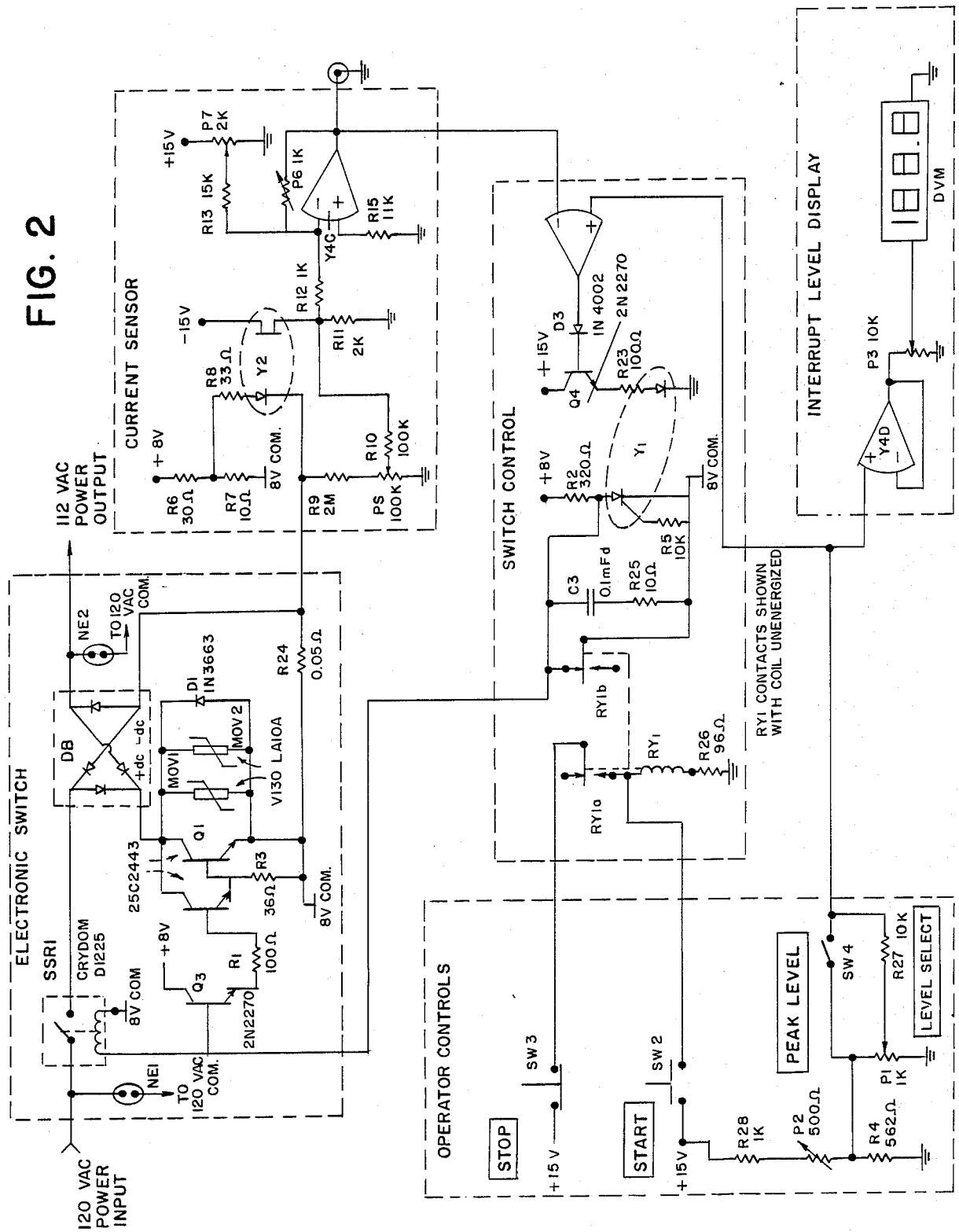
FIG. 2 shows schematically various circuit elements in each block of the interrupter indicated in FIG. 1.

The system schematic diagram of an exemplary system, to which the present invention is not limited, is shown in FIG. 2. This diagram has been simplified by deleting power supply, fuses, main power switch, blower motor, and ac neutral connections. While these are essential to the construction and operation of the device, they need not be addressed in the functional description of the system.

Electronic Switch

The Electronic Switch controls the flow of ac current to the load. Although it is comprised of several components, the primary current-switching devices are solid state relay SSR1 (for example, Crydom Model D1225) and transistor Q1 (Fuji Model 2SC2443). The other components are part of the drive, current sensing, line voltage sensing, ac rectification or protection circuitry. The Electronic Switch is closed when the Switch Control drives the voltage at the base of Q3 (2N 2270) up to approximately 8 volts (referenced to the emitter of Q1 or 8 Vdc Com.). This also closes SSR1 and turns on the Darlington-connected combination of Q3, Q2, and Q1. Thus, line current flows through SSR1, down the first (vertically-illustrated) leg of the diode bridge DB, Q1, through the sampling resistor R24 (0.05 ohm), and up the other (vertically-illustrated) leg of DB to the ac output terminal of the device. The Electronic Switch is opened when the Switch Control reduces the voltage at the Q3 base below approximately 3.0 Vdc. With its base current now removed, Q1 terminates conduction in 50 microseconds or less on loads shunted by a short circuit.

Provisions can be taken to protect the functional integrity of the high-speed switching elements and to allow visual indication of line voltage at points in the circuit. To assure that control of Q1 is not lost due to thermal derating, forced air cooling is provided for Q1 and the diode bridge DB. The metal oxide varistors MOV1 and MOV2 (V130LA10A) are essential to the protection of Q1 from inductive surges which do occur when the Electronic Switch is opened at a non-zero crossing point of the load current. Diode D1 (IN 3663) provides protection to Q1 and Q2 in the event of a short in DB, which could permit negative voltage to be applied to the Q1 emitter. Neon lamps NE1 and NE2 respectively indicate the presence of line voltage at the SSR1 input and at the DB output in the Electronic Switch.

Power for the Electronic Switch circuit is provided by a "floating" 8 Vdc power supply. This dc supply is referenced through R24 to the negative side of the 120 V pulsating unipolar waveform that appears at the negative output (−dc) terminal of the diode bridge DB. R1 may be 100 ohms.

Current Sensor

The Current Sensor translates a signal from the sampling resistor R24 in the Electronic Switch into a voltage waveform which is proportional to the absolute value of the line current waveform (for example in the ratio of 1 volt = 10 A). The R24 signal waveform is negative-going and pulsating; this signal drives the cathode of the LED of optical coupler Y2. The 8 Vdc power supply was selected as a matter of convenience, but the resistors R6, R7, and R8 were selected carefully to bias the LED into the lower end of the linear portion of its conduction-emission range. If a five-volt supply were to be used, it would be necessary to recalculate the values of the resistors R6 to R7, and R8 to obtain the same level of bias current in the Y2 LED. The bias current through the Y2 LED is approximately 25 mA, with a 1.1 volt drop across it. A 10 A increase in the instantaneous value of the load current will produce approximately a 12.5 mA increase in the LED current.

The output current of Y2 produces a negative voltage across R11 having a dc offset and a waveform directly proportional to the waveform of the line current passing through R24. Amplifier Y4C with its associated resistor network inverts, scales, and offset-compensates the signal output by Y2. Potentiometer P7 and resistor R13 are used to cancel the dc offset. Potentiometer P6 scales the Y4C output voltage waveform to represent the instantaneous load current with a factor of 1 Vdc=10 Aac RMs. Resistors R9 and R10 and trimpot P5 are used to null out an undesired 60 Hz signal inductively or capacitively coupled to R11 from the 120 Vac circuit. The Y4C output is used as the feedback signal and is earth-ground-referenced for external observation and measurement.

Other methods for sensing load current and providing isolation from line voltages were considered. Current transformers were tried, but they could not reproduce frequency components of a rectified signal from the current sensor that were below 20 Hz. A Hall device was tried and found to work well for the range between dc and 20 Hz, but its signal-to-noise ratio was so poor that a magnetic-field intensification coil and magnetic core were required. This added inductance to the load circuit, and the output of the Hall device appeared to have a bandwidth less than 2.0 kHz. This limitation on the bandwidth of the feedback signal added considerable delay to the response of the entire system, in its attempt to interrupt current being delivered to a short-circuit load. A combination of these two methods could have been used, but the required number of components and circuit complexity would have increased substantially.

Switch Control

The Switch Control output signal determines the conduction state of the Electronic Switch, based on input from the current Sensor and the Operator Controls. The Switch Control signal is a logic signal with levels of approximately 0.0 Vdc (8V COM) and +8.0 Vdc and is applied to the base of Q3 (which is activated by approx. 1.8 Vdc min.) and to the control leads of SSR1 (which is activated by approx. 3.0 Vdc min.). The Switch Control signal is developed by a wired-OR combination of signals from the RY1b (normally closed, n.c.) contacts of relay RY1 (shown with coil unenergized) and the SCR of optical coupler Y1. When the RY1b (n.c.) contacts are closed (RY1 coil not energized), or when the SCR has been triggered, the Switch Control signal level is pulled down to its low level, forcing the Electronic Switch open. However, the Electronic Switch can be closed again only when the RY1b (n.c.) contacts are opened (RY1 energized) and the Y1 SCR is non-conducting.

Relay RY1 is configured to provide operator control of the state of the Electronic Switch, insuring that it is initialized to the OFF state when the main power switch is closed, to apply line voltage to the Electronic Switch, dc power supplies, and the Interrupt Level Display. The RY1b (n.c.) contacts of RY1 divert current from the base of Q3 until the RY1 coil is energized by the operator closing the START switch SW2. RY1 is latched when the RY1a (normally open, n.o.) contacts complete a current path from the +15 Vdc power supply through the (n.c.) STOP switch SW3, the RY1 coil, and resistor R26 to dc ground. Resistor R26 limits the current to the RY1 coil to reduce its heat dissipation. The current path is broken when the operator, desiring to manually open the Electronic Switch, opens SW3.

The Y1 SCR provides fast response to overcurrents detected by the differential amplifier Y4B. When differential amplifier Y4B detects a Current Sensor signal more positive than the Interrupt Level signal, it saturates in the positive direction (approximately 13 Vdc) and delivers current through D3 (1N 4002) to the base of Q4 (2N 2270). The resulting Q4 emitter current energizes the Y1 LED which triggers the Y1 SCR to force the Switch Control signal to its low logic level, in less than two microseconds. (The bulk of the time lapse in the opening of the electronic Switch involves the turn-off time of the main power transistor Q1.) The SCR remains in conduction until the RY1a contacts return to their normally closed state, upon the deenergizing of the RY1 coil by the opening of either the STOP switch or the main power switch.

Operator Controls

The Operator Controls include a START switch, a STOP switch, a PEAK LEVEL switch, a LEVEL SELECT Control (ten-turn pot), and a main power switch (not shown in the schematic). The START switch is manually activated to turn on the Electronic Switch and allow load current to flow to the load. The STOP switch allows the operator to manually interrupt power to the load. The LEVEL SELECT control permits the operator to select an automatic turn-off load-current level anywhere up to a value of 20 Aac RMS. The PEAK LEVEL switch momentarily increases the interrupt level from any small preset level up to the full maximum of 20 Aac RMS.

The output voltage of the LEVEL SELECT control is the reference level for comparator Y4B. The input voltage to potentiometer P1 is limited to a value corresponding to an ac load current of 20 A RMS by series-connected adjustable resistor P2 and fixed resistors R28 and R4. Another fixed resistor R27 is connected between the P1 wiper and the inverting input of Y4B. The PEAK LEVEL switch SW4 is used to bypass P1 and apply a reference voltage to Y4B corresponding to the ac load current limit of 20 A RMS. Resistor R27 permits SW4 to raise the Y4B inverting input voltage to the 20 Aac RMS equivalent level when the P1 output is at or near zero. Closing SW4 thus provides a convenient way of momentarily increasing the maximum interrupt level in order to prevent premature automatic shutdown from load start-up current surges.

The amplitude of the start-up current surge is a function of the impedance and warm-up characteristics of the load. For example, one microwave oven exhibited a turn-on surge 2.5 times greater than the steady-state value. A typical incandescent lamp was found to exhibit current surges up to 3.5 times the steady-state value. Both reached steady state within two line cycles.

Interrupt Level Display

The Interrupt Level Display indicates the interrupt level selected by the operator. The output voltage of the LEVEL SELECT control P1, which corresponds to the interrupt level, is buffered by op-amp Y4D and scaled by P3 so that the digital panel meter displays in units of RMS current. One volt into the digital panel meter is displayed as 10 A RMS.

Performance Characteristics

Figure 3:
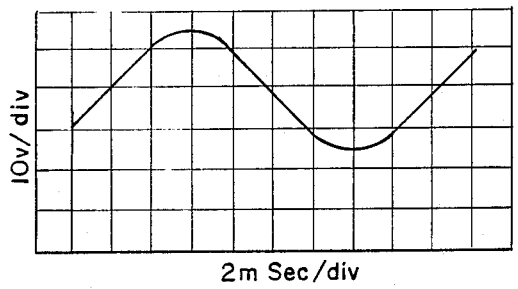
FIG. 3 shows the voltage waveform with distortion in the output current of a power interrupter of the present invention, as delivered to a 1300 watt resistive load, with the indicated scales for the two axes.
Figure 4:
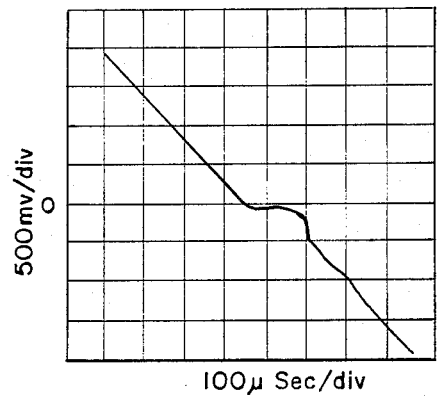
FIG. 4 shows an expanded part of the waveform of FIG. 3, including distortion at zero-crossing.

The UFSSPI requires an input line voltage of 110 to 130 Vac for proper operation, and its output is approximately 7.8 Vac RMS below the input voltage at a load current of 9.4 Aac RMS. The interrupter can deliver a maximum steady-state output current of 20 amperes Aac RMS. Some harmonic distortion may be introduced into the 60 Hz waveform delivered to the load as shown in FIGS. 3 and 4. FIG. 3 shows the distortion occurring near zero crossing in the waveform of the current delivered to a 1300 W resistive load. FIG. 4 shows an expanded view of this zero-crossing distortion. At the point of discontinuity, the current is near zero for approximately 150 microseconds.

Figure 5:
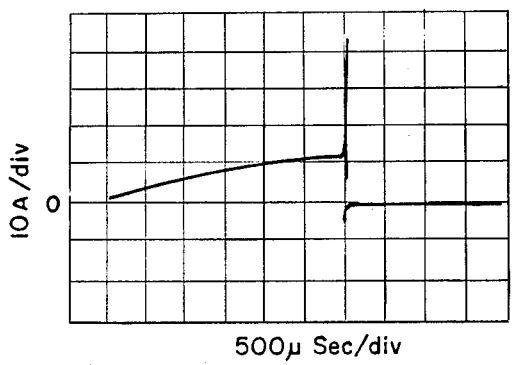
FIG. 5 shows a waveform for the current supplied via a power interrupter of the present invention to a shorted 1300 watt resistive load.
Figure 6:
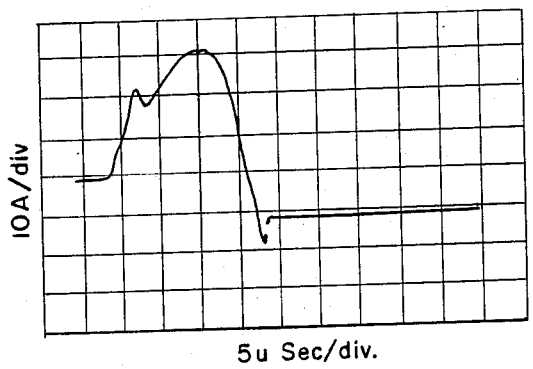
FIG. 6 shows an expanded part of the current waveform of FIG. 5, namely with the transient when the current is interrupted.

The above power interrupter will turn on at the next zero crossing of the line voltage waveform following the opening of relay contacts RY1a, but will turn off automatically in 50 microseconds or less following the incidence of an instantaneous current that exceeds the selected interrupt level. FIG. 5 illustrates the ability of the UFSSPI to terminate the flow of current to a 1300 watt resistive load (interrupt level =10 Aac) after a short circuit has been introduced across the load. For testing purposes, a short circuit was introduced by an externally connected SCR fired at the peak of the line-voltage waveform. FIG. 6 provides an expanded view of the load-current waveform, through a turnoff interval which begins just before the shorting SCR is fired and ends with complete opening of the Electronic Switch. This figure shows that turnoff does not begin until the instantaneous load current exceeds approximately 28 amps, but load current drops to zero in approximately 20 microseconds.

Figure 7:
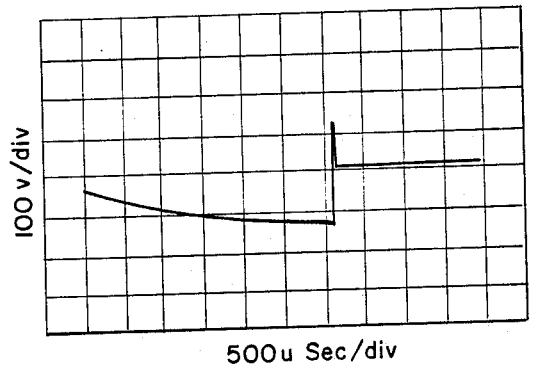
FIG. 7 shows a waveform of voltage output from a power interrupter of the present invention to a 1300 watt load, through a variac, with the power switch being opened at the peak of line voltage.
Figure 8:
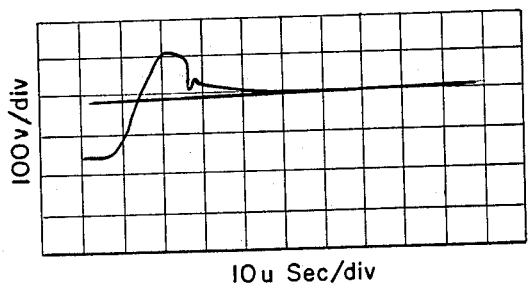
FIG. 8 shows an expanded part of FIG. 7, namely with the transient due to current interruption.

The necessity of designing the UFSSPI to withstand line-voltage transients is illustrated in FIG. 7 through 10. To facilitate the investigation of the response of the UFSSPI to line-voltage transients generated by inductive loads or input through other sources in the power line, a trigger pulse synchronized to the peak of the line voltage waveform was connected into the Switch Control section of the interrupter at the base of transistor Q4. This was done to test under such worst-case conditions as the STOP switch being activated at the peak of the ac current waveform while driving a heavy inductive load, or the Electronic Switch sitting in the open state and a line voltage transient (from a source external to the interrupter) entering through the powerline input. For some of the situations shown in the figures, the line-synchronized pulse was used to pre-trigger an oscilloscope and a second pulse, delayed a few milliseconds from the original pulse, used to drive the Q4 base. This permitted observation of the circuit conditions before and after a shutdown control signal was applied. FIG. 7 shows the waveform of the load voltage when the load consisted of a variac (auto transformer) driving a 1300 W resistive load and the Electronic Switch was opened at the negative peak of the line voltage waveform. The reverse kickback voltage transient which resulted when the electronic switch was opened can be seen. FIG. 8 is an expanded view of the transient portion of the FIG. 7 waveform. It shows the decaying oscillatory pattern caused by the inductance of the load.

Figure 9:
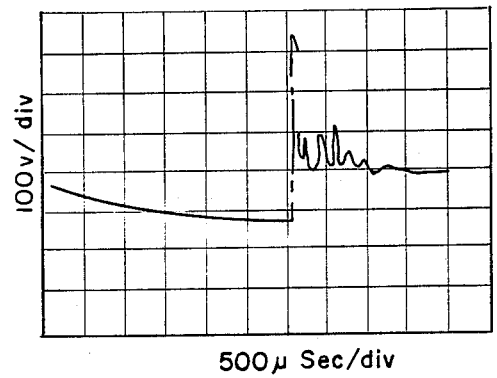
FIG. 9 shows a waveform of the voltage provided via a power interrupter of the present invention to a sending motor.

The voltage transient characteristics of a load containing an electro-mechanical commutator were examined using a portable (12 Aac-rated) electric grinding motor. When this test was first attempted, the starting current of the motor exceeded 20 Aac RMS and caused the Current Sensing and Switch Control of the power interrupter to open the Electronic Switch before the motor began to rotate. The power interrupter was enabled to drive the grinding motor in normal fashion by first energizing the motor directly from another electrical outlet, removing the motor power plug, and quickly reconnecting it to the power interrupter. The back emf generated by the motor armature motion reduced the startup current surge that the interrupter was expected to deliver. FIG. 9 shows the inductive voltage transient that resulted when the Electronic Switch was opened at the peak value of the line-voltage waveform. Also visible is the chopping action of the motor commutator as the transient decays.

Figure 10:
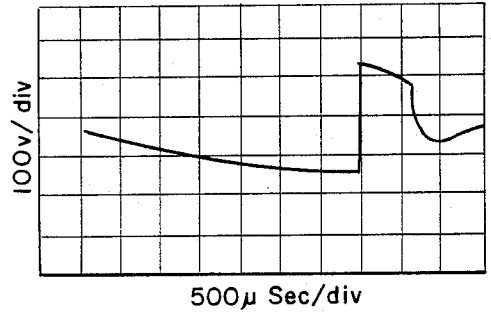
FIG. 10 shows a waveform for the voltage provided via a power interrupter of the present invention to a microwave oven, wherein the current is interrupted when the line voltage is at its maximum instantaneous level.

In a test of the intended application of the UFSSPI, a 1500 watt microwave oven was used as a load. FIG. 10 illustrates the voltage waveform of the microwave oven when its input power was interrupted by line-synchronized opening of the interrupter's Electronic Switch at the peak of a line voltage cycle. Note that FIG. 10 also shows that the transient voltage has been clipped at approximately 350 Vdc by the MOV (metal oxide varistor) devices in the Electronic Switch. This demonstrates that the Electronic Switch in the UFSS power interrupter can withstand voltage surges when it opens the circuit of an inductive load, as well as the current surges resulting from the short circuiting of a load. Tests conducted in the development of the Electronic Switch circuit showed that the transistors Q1 and Q2 would be destroyed when the same microwave oven was used as the load without voltage surge protection such as provided by MOV1 and MOV2. FIG. 10 also shows that the decay time of voltage across an inductive load can be much greater from manual opening of the Electronic Switch than for automatic opening occurring in response to the introduction of a short across the load.

The appearance of a voltage transient at the output terminals of the power interrupter during initial power-up was investigated. With no external load connected to the output, closing of the main power switch was seen to cause a brief illumination of NE2. Oscilloscope measurements indicated the cause of this to be a 60 Hz voltage transient which decays exponentially in approximately 80 milliseconds. Connecting a load to the output terminals was seen to hasten the decay rate of this transient. A 27 watt load, for example, reduced the transient duration to 60 microseconds. The intended load of 1000 watts minimum could be expected to reduce the duration to less than 10 microseconds. As expected, no visible indication of the transient by NE2 indicator could be observed with the 27 watt load.

Though the occurrence of the transient is considered to be of little consequence, its origin was investigated. The source of the transient was determined to be the 120 Vac line supply conducted along a path through the RC snubber network of the solid state relay SSR1, the diode bridge DB, the overvoltage protectors MOV1 and MOV2, the current-sampling resistor R24, and again through DB to the output terminals. DB converts the waveform of the feedthrough voltage to a pulsating unipolar form, charging the capacitor formed by the parallel combination of MOV1 and MOV2. This combination was found to have a capacitance of 1000 picofarads. It is this capacitor in series combination with the impedance of the load which determines the decay time of the transient discussed in the preceding paragraph.

Packaging

The UFSSPI of the present invention can be provided with a chassis attached to the reverse side of a front panel, and the combination top loaded into a box with a hinged cover. The input power cord can be stored under the hinged cover for transportation. The user controls, the digital panel meter for reading out the Interrupt Level setting, the rectified waveform output connector, and the power output sockets can be located on the front panel. The entire unit can thus weigh approximately 43 kg. (19.5 lb).

The chassis panels, heat sinks, and cooling fan can be provided in the interior of the UFSS power interrupter. The principal current-control transistor Q1 of the Electronic Switch can be mounted on heat sinks directly in the air discharge path of a fan. The circuit board containing the integrated circuits and most of the discrete electronic components can be mounted vertically near the center.

To further characterize and restate various features of the present invention as above, the UFSSPI of the subject invention protects for instance a 120 Vac line-operated load by disconnecting the load from the line. The load for the UFSSPI can be any electrical device for instance requiring up to 20A at 120 Vac with an ordinary three-prong line plug. The UFSSPI of the present invention uses solid-state switching to disconnect the load from the power line. A power Darlington-connected transistor Q1 stops conducting when the base current is removed from drive transistor Q3. This turn-off of Q1 opens the conduction path through the diode bridge DB which is directly in the series path of the load current. Q1 is either fully ON or fully OFF depending on the status of the photo-SCR in the opto-coupler Y1 of the Switch Control section. If the photo-SCR is in its conducting state, the Q3 base current is grounded. If the photo-SCR is not in conduction, then resistor R2 delivers current to the Q3 base. The electromechanical relay in the UFSSPI assures proper initializing of the photo-SCR on power turn-on, and turns off the device by shorting the Q3 base current to ground when the "STOP" button is activated. Load current at no time is directed through contacts of the electromechanical relay, and at no time is the turnoff speed of the UFSSPI dependent upon this relay when an overcurrent situation has occurred. The UFSSPI is triggered OFF when the load current exceeds an arbitrary limit as determined by a temperature-stable differential amplifier. A turn-off trigger pulse is not required for the main switching transistor to turn OFF; only the removal of the base current to the drive transistor Q3 is required.

The UFSSPI employs a bridge rectifier to make it useful on ac loads, and it contains the opto-isolators described in connection with FIG. 2 above for both control and for feedback, and employs an isolated dc supply. The subject invention, as indicated above, uses a differential amplifier to sense the error between a reference level and the level of the load current. The reference can be continuously adjusted over a range from zero to approximately 20 A, in the example embodiment of the present invention. Also, a selected limit of less than 20 A may momentarily be expanded to that maximum level of 20 A by activating the PEAK LEVEL button. While the turn-off time of the UFSSPI may be delayed by the charge storage in the main switching transistor and the propagation delay of its sensing and drive circuits, none of these involve the discharge or charging of an external capacitor. The UFSSPI uses a full wave diode bridge, power transistor, and sampling transistor. The drive circuitry for the UFSSPI is simpler because only one transistor is used as the principal switching element. The UFSSPI of the present invention can have a linear adjustment down to approximately zero Aac. The subject invention uses a differential amplifier which continuously monitors an amplified, rectified signal representative of the load current. As described above the UFSSPI has varistor protection against voltage transient damage. The subject invention latches OFF until restarted by the operator. The subject invention has a commercial solid state relay connected in series with its diode bridge to provide zero-crossing turn-on. This eliminates abrupt turn on, helps limit inrush currents, and provides a redundant means of load current turn-off if the diode bridge and power transistor combination fails shorted for some reason.

The subject invention has manual START and STOP switches by which the operator may start and stop the load current as he wishes. Again, the PEAK LEVEL switch allows the operator to temporarily raise the trip point level to permit an inrush current such as up to 20 A. When the switch is released, the trip point level drops to the level selected by the LEVEL SELECT potentiometer. As indicated above, one of the opto-isolators of the subject invention (Y2 in the UFSSPI of FIG. 2) was especially designed into the circuit for the purpose of isolating the feedback section. The effective gain of this opto-isolator is very nearly constant throughout the range of input currents in which it is used. Hence, the output voltage waveform of amplifier Y4c closely represents that of the rectified load current. The calibration of amplifier Y4c can be adjusted (using P6) to output a voltage waveform which represents that of the load current by a ratio of 1.0 Vdc (Y4c output) to 10.0 Aac (load current).

Variations and modifications of the teachings and exemplary embodiment above can be readily provided by a skilled worker in the art, without departing from the scope of the present invention as defined by the following claims.

What is claimed is:

1. A power interrupter, comprising
    an electronic switch means for (1) receiving ac power as an input and outputting corresponding ac power to a load, (2) receiving as a further input an interrupt control signal, (3) interrupting said outputting of said corresponding ac power to said load depending on said interrupt control signal, and (4) outputting, separately from said ac power to said load, an output corresponding to the absolute value of the instantaneous current of said ac power output to said load,
    a current sensor means for (1) receiving as an input said output from said electronic switch means corresponding to said instantaneous load current, and (2) outputting an output corresponding to said absolute value of the instantaneous load current;
    a switch control means for (1) receiving as an input said output from said current sensor means corresponding to said absolute value, (2) comparing said input thereto with a value corresponding to a set limit for said absolute value, and (3) providing as an output said interrupt control signal of said input to said electronic switch means in accordance with the result of said comparison;
    wherein (1) said output of said ac power to said load is interrupted when the absolute value of said instantaneous load current exceeds said set limit (2) said electronic switch means includes a solid state relay and a first transistor connected operatively in series with each other between respective parts of said electronic switch means for said receiving of said ac power and for said outputting of said ac power to said load, said load current flowing unidirectionally in said first transistor, and the current of said ac power input to said electronic switching means flowing as ac current through said solid state relay, and (3) said interrupt control signal opens said solid state relay and first transistor for said interrupting of said ac power output by said electronic switch means to said load.

2. The device of claim 1, wherein said load current is interrupted by said electronic switch means according to said interrupt control signal in less than 100 microsec after said absolute value of said load current exceeds said set limit therefor.

3. The device of claim 2, the interrupt time for said load current interruption being at least as short as 50 microsec.

4. The device of claim 1, said load current of said ac power output to said load being operatively supplied substantially at the same voltage as said ac power supplied to said electronic switch means.

5. The device of claim 1, wherein said load current is supplied from said electronic switch means to said load in the form of a sinusoidal ac waveform.

6. The device of claim 2, comprising varistor means connected across output terminals of said first transistor for limiting the voltage across said output terminals of said first transistor, said load current flowing through said first transistor via said output terminals.

7. The device of claim 6, comprising
    start signal means for indicating when the output of said ac power to said load is to begin,
    said first transistor being Darlington-connected with a second and a third transistor, and said interrupt control signal being applied to a gate of said third transistor, and
    said solid state relay comprising means for preventing said solid state relay from closing, to begin said output of said ac power to said load, until the first zero-crossing of a line voltage of said ac power input to said electronic switch means after actuation of said start signal means.

8. The device of claim 1, said electronic switch means comprising a diode bridge of four diodes, connected with said solid-state relay, first transistor and said respective part of said electronic switch means for said outputting of said load current, wherein said load current does not begin to flow until the first zero crossing of the line voltage of said ac power input into said electronic switch means after a respective start signal is supplied to said switch control means for starting said output from said electronic switch means of said load ac power.

9. The device of claim 1, comprising a common ground for said input and output ac power of said electronic switch means, wherein a voltage corresponding to said load current is referenced in said current sensor means to said common ac power ground in said current sensor means and provided as said output from said current sensor means to said switch control means 10. The device of claim 9, said output from said electronic switch means having a unipolar waveform.

11. The device of claim 1, said current sensor means comprising
    opto-isolator means operatively connected between said input and output thereof for providing respective isolation therebetween, said opto-isolator means including LED means biased in the lower end of a linear conduction range thereof, for providing said output of said current sensor means a linear amplification of any increment in said input to said current sensor means due to any increment in said load current, said LED means including a light emitter and a detector of the emitted light, and
    means for cancelling offset and scaling of a signal from said light detector of said LED means, for thusly providing offsetting and scaling of said output of said current sensor.

12. The device of claim 1, said switch control means comprising optical-coupling means, connected between said input and output of said switch control means, for providing respective isolation therebetween, comparison means for said comparing of said input to said switch control with said value corresponding to said set limit, and start and stop signal inputs, for receiving respective start and stop signals, respectively, for starting said outputting of said ac power to said load from said electronic switch means and said comparing when a respective start signal is supplied thereto, and for stopping said outputting of said load current to said load when a respective stop signal is supplied thereto.

13. The device of claim 12, comprising operator control means for selecting said predetermined level, and for selectively providing said start and stop signals to said switch control, wherein said ac power is first supplied via said electronic switch means to said current sensor means, switch control means and operator control means for operating same, and said supplying of said load current to said load does not begin until said start signal is selectively provided by said operator.

14. The device of claim 13, said operator control means including varying means for selectively reducing from said set limit the level for said absolute value of said load current at which said load current is interrupted by said electronic switch means as a result of said interrupt control input thereto, wherein said level is thereby selectively variable from said set limit down to zero, and peak level means for disabling operation of said varying means when engaged by said operator, so that said load current is output from said switch control means and said interruption thereof occurs at said set limit while said peak level means are engaged by said operator.

15. The device of claim 14, comprising an interrupt level display for displaying said level set by said varying means when said peak level means is not engaged, at least when said load current is provided to said load, and for displaying said set limit when said peak level means is engaged.

16. The device of claim 1, comprising means for varying said set limit for which said interruption occurs.

17. The device of claim 14, comprising means for varying said set limit for which said interruption occurs when said peak level means is engaged by said operator.

18. The device of claim 16, wherein said output from said current sensor means is proportional to said absolute value of said ac current to said load, and said interruption begins to occur within a precision of $+/-0.2$ amp of said set limit for said absolute value of said ac power output to said load, for a line voltage of said input ac power input to said electronic switch means in the range from 110 to 130 volts ac rms.

19. The device of claim 15, wherein said output from said current sensor means is proportional to said absolute value of said ac current to said load, and each said interruption begins to occur with a precision of $+/-0.2$ amp of the respective limit for said absolute value of said ac power output to said load, and a maximum value for said set limit is 20 amp ac rms, for a line voltage of said input ac power input to said electronic switch means in the range from 110 to 130 volts ac rms.

20. The device of claim 1, wherein each of said current sensor means and said switch control means include opto-isolator means employing light emission and detection, for providing respective electrical isolation between the respective ones of said inputs and outputs thereof.

21. The device of claim 1, each said electronic switch, current sensor and switch control means comprising respective circuitry provided with the same floating ground and a source of a constant voltage with respect to said floating ground.

22. The device of claim 12, wherein said output of said ac power to said load does not begin until the first zero crossing of the line voltage of said ac power input into said electronic switch means after a respective start signal is supplied to said switch control means for starting said output from said electronic switch means of said load ac power.

23. The device of claim 1, wherein said output of said ac power to said load does not begin until the first zero crossing of the line voltage of said ac power input into said electronic switch means after a respective start signal is supplied to said switch control means for starting said output from said electronic switch means of said load ac power.

24. The device of claim 21, wherein a voltage corresponding to said load current is referenced in said electronic switch means to said floating ground of said constant voltage source and provided as said output from said current sensor means to said switch control means.

* * * * *